(12) United States Patent
Jenkins, IV (10) Patent No.: US 6,316,958 B1
(45) Date of Patent: Nov. 13, 2001

(54) PROGRAMMABLE LOGIC DEVICE WITH ADJUSTABLE LENGTH DELAY LINE

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/573,476

(22) Filed: May 16, 2000

(51) Int. Cl.[7] ................................................. H03K 19/177
(52) U.S. Cl. ................................................. 326/40; 326/38
(58) Field of Search .................... 326/37–41, 46

(56) References Cited

U.S. PATENT DOCUMENTS

| 4,703,206 | * | 10/1987 | Cavlan .................................. 326/41 |
| 4,903,223 | * | 2/1990 | Norman et al. ........................ 326/41 |
| 5,898,318 | * | 4/1999 | Pedersen ............................... 326/41 |

OTHER PUBLICATIONS

Rhyne, Fundamental of Digital Systems Design, NJ, pp. 70, 71, 1973.*

* cited by examiner

Primary Examiner—Michael Tokar
Assistant Examiner—Don Phu Le
(74) Attorney, Agent, or Firm—Bayer Hoffman & Harms, LLP (57) ABSTRACT

A programmable logic device including an adjustable length delay line formed by selectively connecting product-term elements in series. Switching circuits connected to the output terminals of each product-term element (e.g., logic AND gates) that allow the product terms to be routed either to the input terminals of a sum-of-products element (e.g., a logic OR gate), or to the input terminal of an adjacent product-term element. The length (i.e., actual signal delay) of the delay line is determined by the number of product-term elements that are connected in series. The output signal from the last product-term element in the series is transmitted through the sum-of-products element. Accordingly, the length of the delay line can be incrementally adjusted by programming the switches to add or subtract product-term elements from the delay line.

17 Claims, 7 Drawing Sheets

PROGRAMMABLE LOGIC DEVICE WITH ADJUSTABLE LENGTH DELAY LINE

FIELD OF THE INVENTION

This invention relates to the field of integrated circuits, and more specifically to programmable logic devices having on-chip delay line structures.

BACKGROUND OF THE INVENTION

Programmable logic devices (PLDs) are a class of integrated circuits (ICs) that can be programmed by a user to emulate various logic functions. Logic designers typically use PLDs to implement control logic in electronic systems because they are relatively easy to program, and often can be reprogrammed to update the emulated logic function. This often makes the use of PLDs less costly in comparison to custom hardwired or "application specific" integrated circuits (ASICs).

One major class of PLDs includes a set of input pins, a programmable AND plane connected to the input pins, an OR plane connected to output terminals of the AND plane, and a set of output pins connected to output terminals of the OR plane. The AND plane includes a series of column conductors, a series of row conductors, and a matrix of programmable switches provided at each intersection of a column conductor and a row conductor. Input signals are applied through the input pins to the column conductors, which are selectively applied to the row conductors through the programmable switches. Each row conductor performs a logic AND or NAND function on all input signals transmitted to that row conductor through a programmed switch (note that input signals are not passed to the row conductor through non-programmed switches). Because of the logic AND (or NAND) function performed by each row conductor, the row conductors are typically referred to as product-term (P-term) elements, and are represented by logic AND gates. These P-term elements generate P-term signals that are transmitted to the OR plane. The OR plane may be programmable to selectively connect each P-term element to any available OR gate, in which case the PLD is called a programmable logic array (PLA). Alternatively, the OR plane may be fixed, such that each P-term element is connected to an associated OR gate, in which case the PLD is called a programmable array logic (PAL) device.

Early PLAs and PALs were well received by logic designers. However, as logic functions grew increasingly larger and more complex, logic designers were required to wire together two or more small PLAs/PALs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as complex programmable logic devices (CPLDs), includes two or more "function blocks" connected together and to input/output (I/O) resources by an interconnect switch matrix. Each function block of the CPLD is structured like the two-level PLAs/PALs, described above. In effect, these CPLDs incorporate several early PLAs/PALs and associated connection circuitry onto a single integrated circuit, thereby allowing a circuit designer to implement a complex logic function using a single IC.

Figure 1:
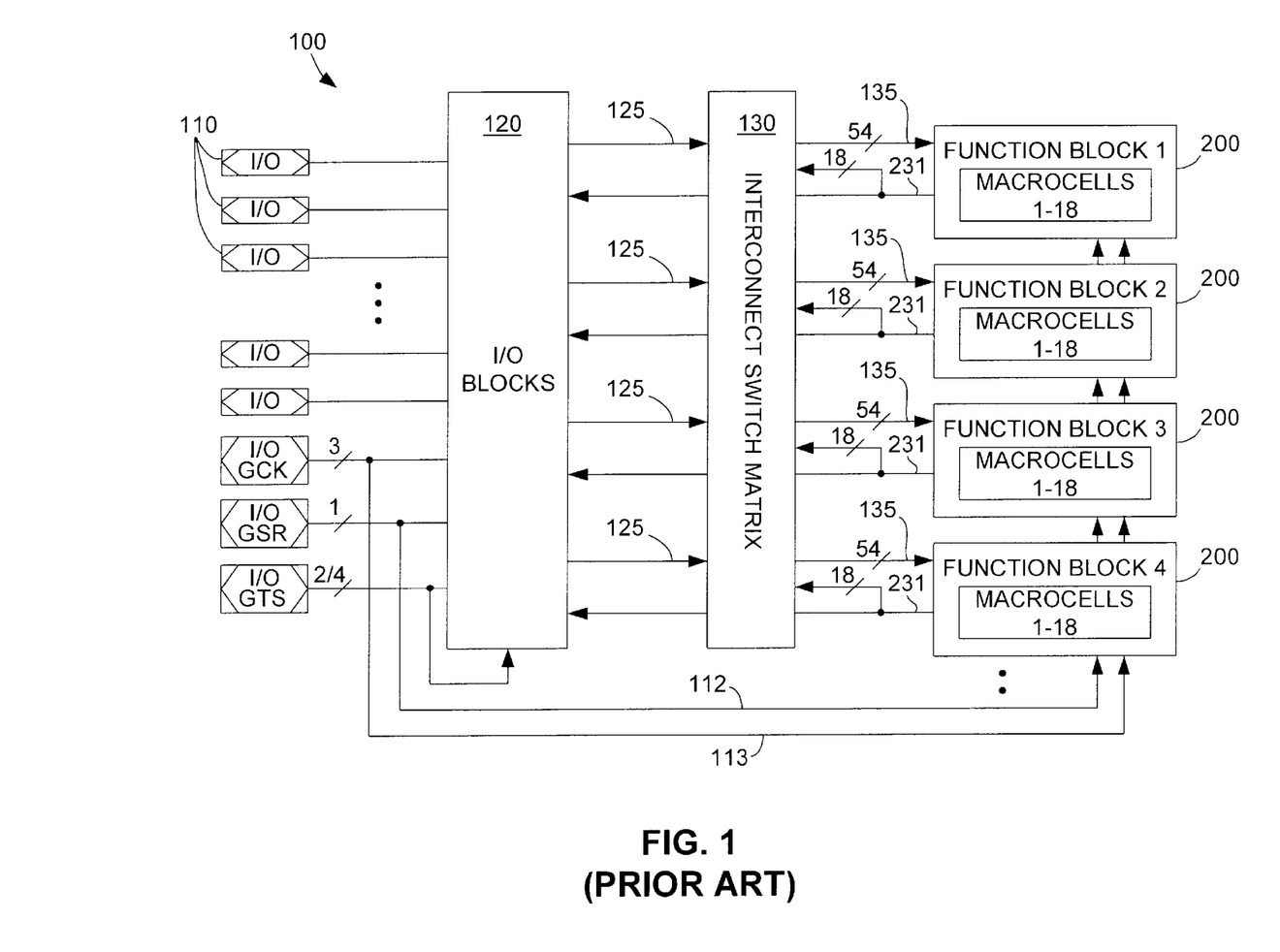
FIG. 1 is a circuit diagram showing a conventional CPLD including multiple function blocks.

FIG. 1 shows a simplified block diagram of a CPLD 100 that includes features common to the XC9500 CPLD family produced by Xilinx, Inc. of San Jose, Calif. Each CPLD 100 of the XC9500 CPLD family consists of input/output (I/O) pins 110, I/O blocks (IOBs) 120, an interconnect switch matrix 130, and several function blocks (FBs) 200 (four shown). IOBs 120 provide buffering for device input and output signals that are applied to I/O pins 110. All input signals from IOBs 120 enter switch matrix 130 on switch matrix input lines 125, and selected output signals from FBs 200 are fed back into switch matrix 130 on macrocell output lines 231. Each FB 200 receives fifty-four (54) input signals on FB input lines 135 from switch matrix 130 and produces ninety (90) P-term signals that are applied to any of eighteen (18) macrocells, each macrocell being programmable to provide a sum-of-products term using selected P-term signals. For each FB 200, up to eighteen output signals are selectively transmitted on macrocell output lines 231 to directly drive I/O blocks 120 (along with optional corresponding output enable signals). In addition, each FB 200 selectively receives global set/reset signals and global clock signals on global set/reset lines 112 and global clock lines 113, respectively. These global signals are utilized to selectively synchronize, for example, the clocking operations of flip flops located in FBs 200.

Figure 2A:
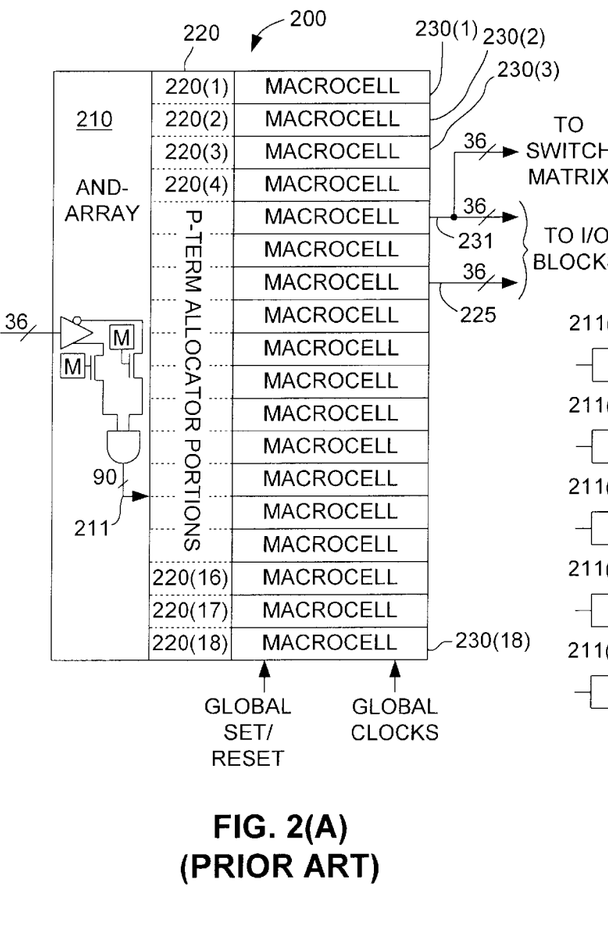
FIG. 2(A) is a simplified block diagram of a function block of the conventional CPLD shown in FIG. 1.

FIG. 2(A) shows a simplified block diagram of an FB 200. Each FB 200 includes an AND array 210, product term (P-term) allocator circuit 220, and eighteen macrocells 230(1) through 230(18). AND-array 210 receives fifty-four (54) signals on input lines 135 from the switch matrix 130 (see FIG. 1), and generates ninety (90) P-term signals that are routed to the macrocells 230(1) through 230(18) via P-term allocator circuit 220. The P-term allocator circuit 220 includes eighteen portions 220(1) through 220(18) that are associated with macrocells 230(1) through 230(18), respectively. P-term allocator circuit 220 selectively routes the P-term signals from AND-array 210 to selected macrocells 230(1) through 230(18) in the manner described below. Output signals transmitted from the macrocells 230(1) through 230(18) are then routed back to the switch matrix 130 on macrocell output lines 231 for use as input signals in other FBs 200, or are routed to corresponding I/O pins 110 through the IOBs 120 along with optional corresponding output enable (OE) signals, which are transmitted on P-term OE lines 225.

Figure 2B:
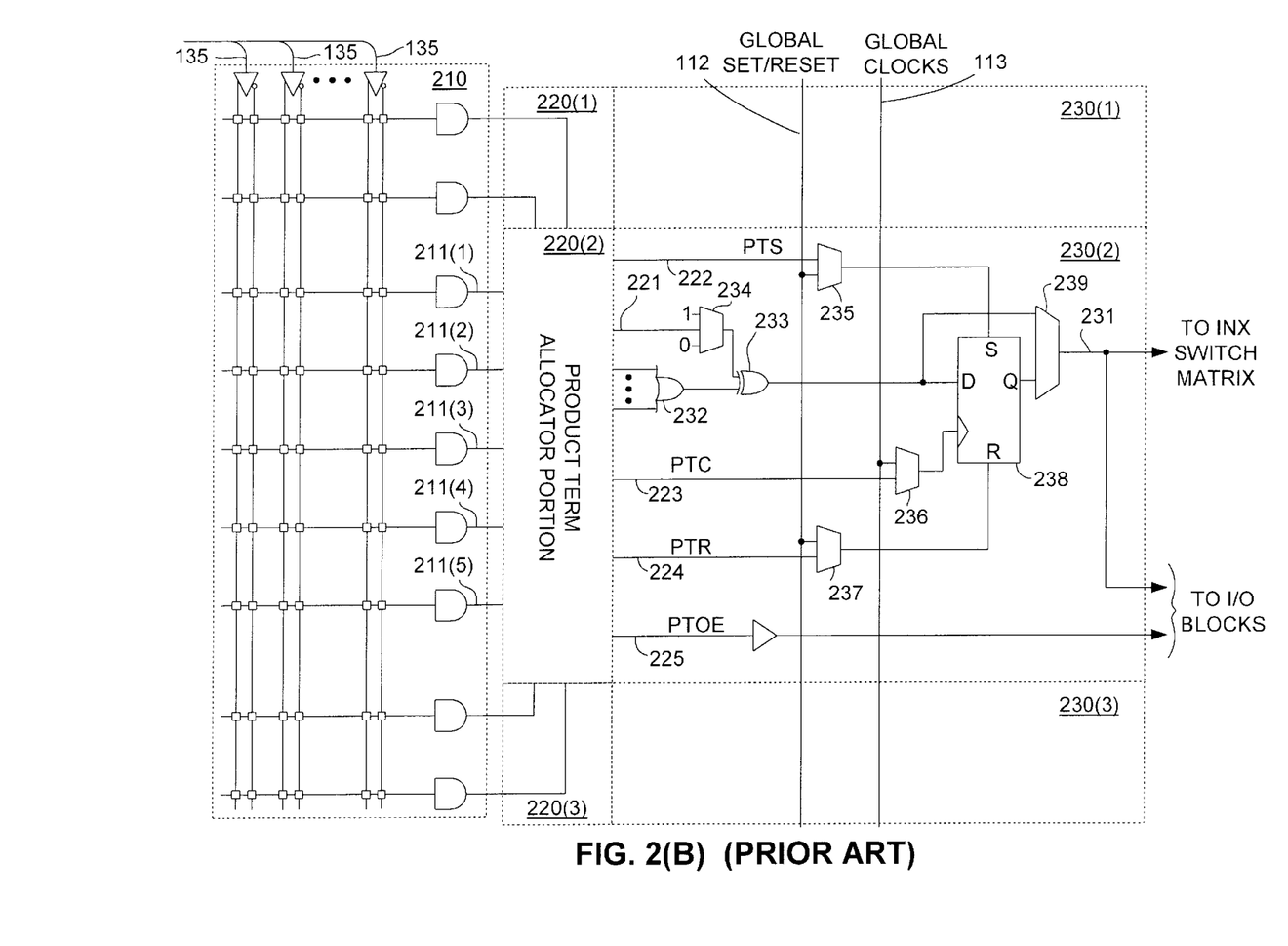
FIG. 2(B) is a simplified schematic diagram illustrating a macrocell of the function block shown in FIG. 2(A)

FIG. 2(B) is a simplified schematic diagram showing macrocell 230(2), which is representative of all eighteen macrocells of FB 200, in additional detail. Macrocell 230(1) includes OR gate 232, an exclusive OR (XOR) gate 233, P-term routing multiplexers (MUXes) 234 through 237, a D-type flip flop 238 and a bypass MUX 239. As discussed further below, macrocell 230(2) receives up to five "direct" P-term elements 211(1) through 211(5) and up to eighty-five (85) "indirect" P-term elements (four shown) through P-term allocator portion 220(2). Unlike the "indirect" P-term elements, the P-term signals transmitted from "direct" P-term elements 211(1) through 211(5) are selectively routed either as logic signals that are applied to OR gate 232 (i.e., to generate a sum-of-products term), or as control signals that are selectively utilized to control the operation of macrocell 230(2). Alternatively, P-term elements 211(1) through 211(5) may be routed by P-term allocator portion 220(2) to other macrocells of FB 200. OR gate 232 generates a sum-of-products term in response to selected P-term signals received from P-term allocator portion 220(2) in accordance with a user's logic function. The sum-of-products term generated by OR gate 232 is transmitted to an input terminal of XOR gate 233, which is also connected to the output terminal of P-term control MUX 234. MUX 234 is controlled by a configuration memory cell (not shown) to selectively pass a P-term invert (PTINV) control signal from P-term invert line 221 to exclusive OR (XOR) gate 233, which then selectively inverts the sum-of products term generated by OR gate 232. P-term routing MUXes 235 through 237 selectively pass either P-term control signals received from P-term allocator portion 220 (2) or global control signals to the control terminals of flip flop 238. For example, MUX 235 is controlled to selectively pass either a P-term set (PTS) control signal from P-term set line 222 or a global set/reset signal from global set/reset line 112 to set terminal S of flip flop 238. MUX 236 is controlled to selectively pass either a P-term clock (PTC) control signal from P-term clock line 223 or a global clock signal from global clock line 113 to the clock terminal of flip flop 238. MUX 237 is controlled to selectively pass either a P-term reset (PTR) control signal from P-term reset line 224 or the global set/reset signal from global set/reset line 112 to reset terminal R of flip flop 238. Finally, bypass MUX 239 has a first input terminal connected to the output terminal of XOR gate 233 and a second input terminal connected to data output terminal Q of flip flop 238. Bypass MUX 239 is controlled by a configuration memory cell (not shown) to selectively pass the sum-of-products term directly from XOR gate 233 to macrocell output line 231 during asynchronous logic operations, or to pass the sum-of-products term from data output terminal Q to macrocell output line 231 during synchronous logic operations.

Figure 2C:
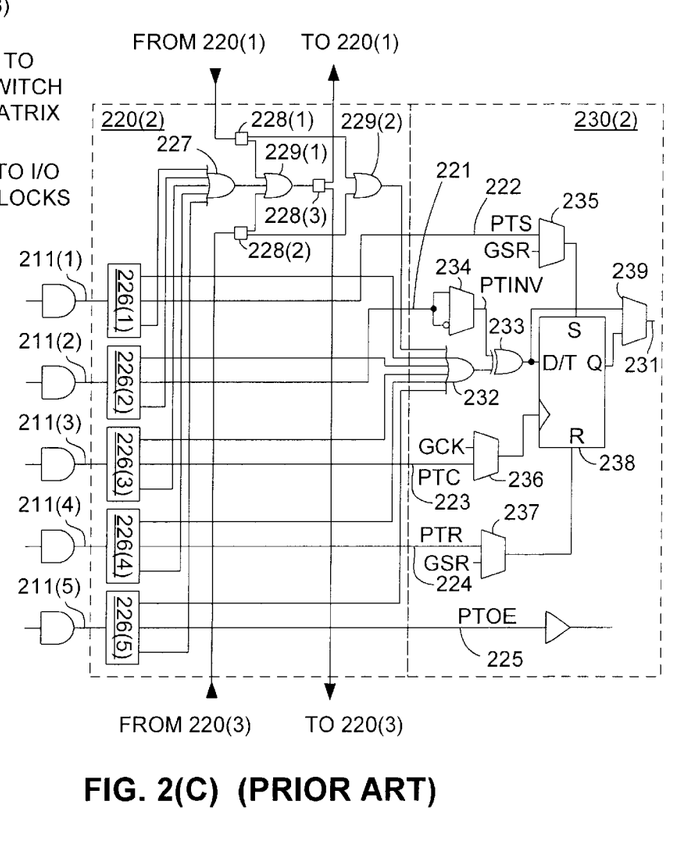
FIG. 2(C) is a simplified schematic diagram illustrating a product term allocator of the function block shown in FIG. 2(A)

FIG. 2(C) is a simplified diagram showing the internal logic of the P-term allocator portion 220(2), which is representative of all of the P-term allocator portions of P-term allocator circuit 220. P-term allocator portion 220(2) includes demultiplexers (DMUXs) 226(1) through 226(5), an OR gate 227, DMUXs 228(1) through 228(3), and OR gates 229(1) and 229(2). P-term elements 211(1) through 211(5) are respectively transmitted to DMUXs 226(1) through 226(5). DMUXs 226(1) through 226(5) are programmable to route their associated P-term elements to any one of three lines: to an input of OR gate 227 of the P-term allocator portion 220(2), to an input of OR gate 232 of the macrocell 230(2), or to an associated local P-term line extending into macrocell 230(2) (respectively, P-term invert line 221, P-term set line 222, P-term clock line 223, P-term reset line 224, and P-term OE line 225). P-term signals selectively transmitted by DMUXs 226(1) through 226(5) to OR gate 227 are "exported" to other macrocells of FB 200. Specifically, the P-term signals transmitted from DMUXs 226(1) through 226(5) to OR gate 227 are "ORed" to produce a sum-of-products term which is applied to OR gate 229(1). OR gate 229(1) selectively "ORs" this sum-of-products term with P-term signals received from adjacent P-term allocator portions 220(1) and/or 220(3) (see FIG. 2(B)), which are received through DMUX 228(1) and/or DMUX 228(2), respectively. The output of OR gate 229(1) is then routed through DMUX 228(3) to adjacent P-term allocator portions 220(1) or 220(3). By selectively combining (ORing) selected P-term signals using the OR gates 227 of the P-term allocator portion 220(2), it is possible to implement equations having up to ninety (90) P-terms in macrocell 230(2).

While P-term allocator circuit 220 and macrocells 230(1) through 230(18) provide many useful features for implementing a user's logic function, there is a need for PLDs providing even more flexibility. For example, many modern systems include multiple signals that are transmitted in parallel through several PLDs to a central processing circuit. Signal timing is often important in these systems. Specifically, it is often necessary to alter the timing of one or more signal paths of the system to assure simultaneous arrival of associated signals at the central processing circuit.

A well known method for synchronizing selected signal paths in modern systems is to route the signal paths through a programmable clock skew buffer circuit, such as the "RoboClock" circuit produced by Cypress Semiconductor Corporation of San Jose, Calif. Signals requiring delay are routed from an output pin of the PLD of the system to the programmable clock skew buffer circuit, which provides the required delay, and then routes the delayed signal to the central processing circuit. A problem with the practice of using programmable clock skew buffer circuits is that these circuits significantly increase the total cost of the systems requiring their use.

What is needed is an adjustable length delay line structure provided on the PLD that allows a designer to selectively delay a signal, thereby reducing the cost of some modern systems by avoiding the need for programmable clock skew buffer circuits.

SUMMARY OF THE INVENTION

The present invention is directed to a delay line structure that can be incorporated into a PLD without significant modification to the existing PLD architecture.

In accordance with the present invention, a delay line of any length is generated on a PLD by selectively linking a selected number of P-term elements in series. Programmable switches are provided between adjacent pairs of the P-term elements that allow the output signal from a first P-term element to be applied to the input terminal of an adjacent P-term element, thereby providing the delay line structure without significantly altering the PLD architecture. The total delay of a delay line is incrementally increased or decreased by adding or removing one P-term element to/from the delay line using the programmable switches. Because a desired signal delay is produced on the PLD using the adjustable-length delay line structure of the present invention, the need for expensive external delay circuits is avoided. Further, by using P-term elements to provide the delay function, an on-chip delay line structure is provided without significantly changing the existing PLD structure.

In accordance with a first embodiment of the present invention, a two-way switch is connected to the output terminal of a first P-term element that selectively connects the output terminal either to the input terminal of an adjacent P-term element, or to a input terminal of a sum-of-products element (e.g., an OR gate). A memory circuit is used to control the switch, which passes signals from the first P-term element to the second P-term element when a first logic value is stored in the memory circuit, and passes signals from the first P-term element to the sum-of-products element when the memory circuit stores a second logic value. Accordingly, the two-way switches programmably connect a desired number of P-term elements in series, thereby providing an adjustable length delay line.

In accordance with another embodiment of the present invention, a method of operating a PLD is provided in which a target signal delay is provided by the adjustable length delay line during an initial configuration operation, then the actual signal delay is measured, and, finally, the initial configuration is adjusted to lengthen or shorten the delay line until the actual signal delay is equal to the target signal delay. This method facilitates "fine tuning" of a delay line to account for slight variations in signal propagation speeds that typically occur due to variations in fabrication process parameters.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to structures and methods for implementing an adjustable length delay line in a programmable logic device (PLD), and is described with particular reference to complex programmable logic devices (CPLDs) such as the XC9500 series of CPLDs produced by Xilinx, Inc., of San Jose, Calif. Although the circuit structures and methods of the present invention are described below with particular reference to CPLDS, some or all of the various aspects of the present invention may be beneficially utilized in other types of PLDs. Therefore, the appended claims should not necessarily be limited to CPLDs.

Definitions

As used in the following description, the term "programmably connected" is used to describe a structural relationship in which a programmable element (e.g., a pass transistor or a programmable logic circuit) is provided between two nodes or elements. In contrast, the un-modified term "connected" indicates either direct connection between two nodes or elements, or connection through an element whose output signal is not controlled by a configuration memory value (e.g., an inverter). For example, the phrase "node A is programmably connected to node B" indicates that at least one programmable element is located between node A and node B, and a signal path is provided between node A and node B when the programmable element is programmed to conduct or transfer signals along the signal path. In contrast, the phrase "node A is connected to node B" indicates that a signal transmitted from node A arrives at node B.

First Embodiment

Figure 3:
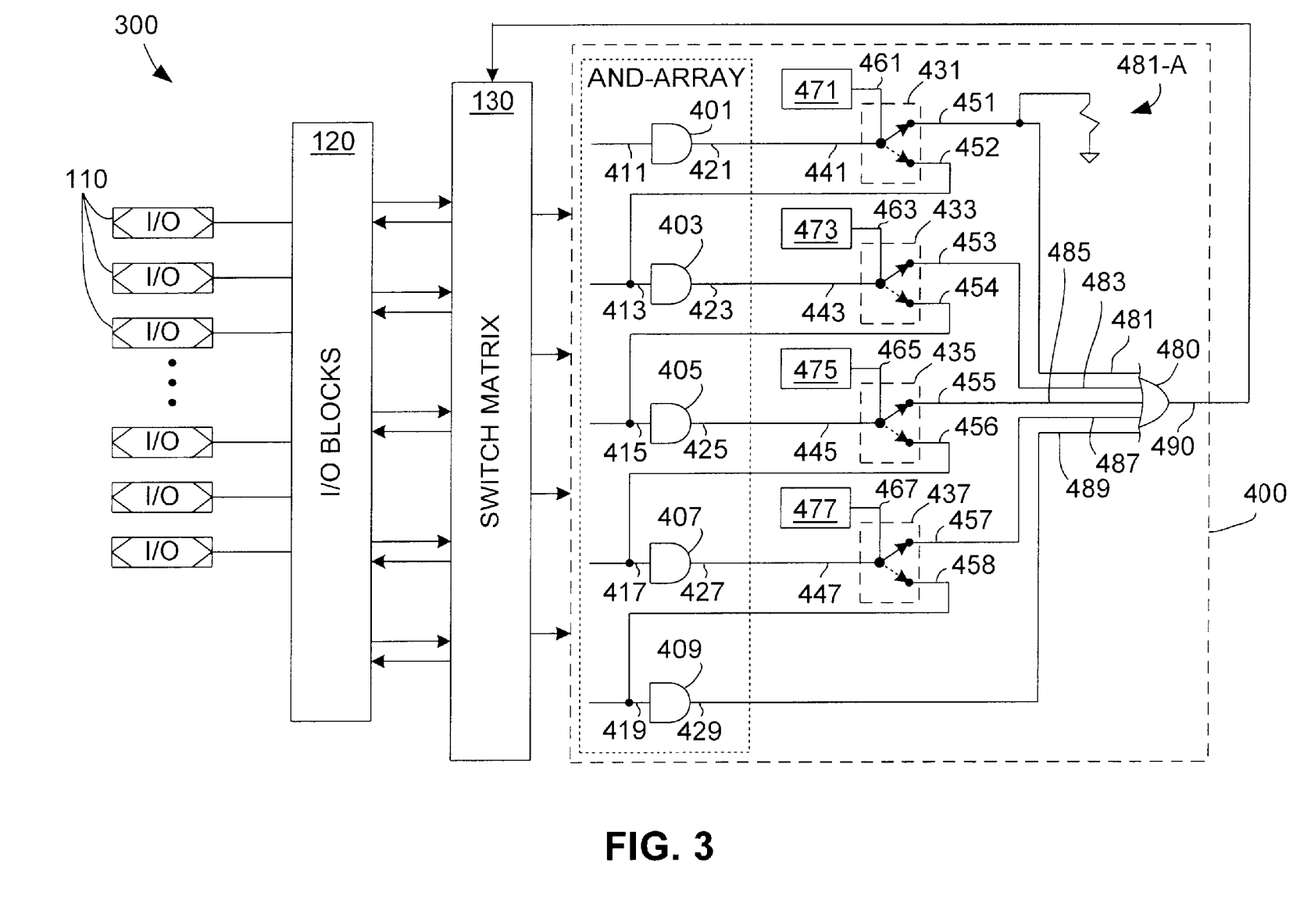
FIG. 3 is a simplified schematic diagram of a CPLD incorporating an adjustable length delay line structure in accordance with a first embodiment of the present invention.

FIG. 3 is a simplified schematic diagram of a CPLD 300 including I/O pins 110, I/O blocks 120, and an interconnect switch matrix 130 that are essentially identical to those of conventional CPLD 100 (described above). In addition, CPLD 300 includes one or more function blocks 400 that include an adjustable length delay line structure in accordance with an embodiment of the present invention.

Function block 400 includes an AND-array including product-term (P-term) elements (depicted as logic AND gates) 401 through 409, a sum-of-products element (depicted as a logic OR gate) 480, and several programmable switch circuits 431 through 437 that are connected between P-term elements 401 through 407 and associated input terminals 481 through 487 of sum-of-products element 480. Although the P-term and sum-of-product elements shown in FIG. 3 are depicted by logic AND and OR gates, respectively, those of ordinary skill in the art will recognize that these elements can be replaced by NAND gates.

P-term elements 401 through 409 respectively include input terminals 411 through 419 and output terminals 421 through 429. Input terminals 411 through 419 are connected to programmable switches (not shown) of the AND-array circuit that are programmed to pass input signals from switch matrix 130 in the manner described above. Although each P-term element is depicted with a single input terminal to simplify the figure, those of ordinary skill in the art understand that these P-term elements are programmably connected to multiple input terminals.

According to a first aspect of the present invention, switch circuits 431 through 437 are programmable to connect any number of P-term elements 401 through 409 in series, thereby forming an adjustable length delay line. As understood by those of ordinary skill in the art, each P-term element 401 through 409 delays signal transmissions by an amount that is determined by the particular circuit design of the P-term elements and the fabrication parameter variations present during the manufacture of CPLD 300. The present inventor recognized that the incremental delay period introduced by each P-term element of a particular CPLD is essentially fixed (constant) for every P-term element of that CPLD, and that a highly predictable delay line is formed on the CPLD when several of these P-term elements are connected in series. Further, the present inventor recognized that the sum-of-product element (e.g., OR gate) 480 of each macrocell in the CPLD provides a convenient "tap" point for routing the delayed signal back to the interconnect switch matrix for subsequent distribution. Accordingly, switch circuits 431 through 437 are provided to programmably connect two, three, four, or all five P-term elements 401 through 409 in series with sum-of-products element 480, thereby forming a convenient adjustable length delay line on CPLD 300.

Referring again to FIG. 3, switch circuits 431 through 437 respectively include input terminals 441 through 447, (first) output terminals 452 through 458, (second) output terminals 451 through 457, and control terminals 461 through 467. Input terminals 441 through 447 are respectively connected to output terminals 421 through 427 of P-term elements 401 through 407. Output terminals 452 through 458 are respectively connected to input terminals 413 through 419 of P-term elements 403 through 409. Output terminals 451 through 457 are respectively connected to input terminals 481 through 487 of sum-of-products element 480. Control terminals 461 though 467 are respectively connected to memory circuits 471 through 477.

Switch circuits 431 through 437 are configured (controlled) by logic values stored in memory cells 471 through 477 to route signals either to an adjacent P-term element 403 through 409, or to sum-of-products element 480. For example, when memory cell 471 applies a first logic value (e.g., 0) to control terminal 461 of switch circuit 431, switch circuit enters a first switching state in which signals are passed from input terminal 441 to (first) output terminal 452. Conversely, when memory cell 471 applies a second logic value (e.g., 1) to control terminal 461, switch circuit 431 enters a second switching state in which signals are passed from input terminal 441 to (second) output terminal 451. Memory cells 473 through 477 similarly control switch circuits 433 through 437.

Both switch circuits 431 through 437 and memory cells 471 through 477 may be constructed using either non-volatile or volatile elements. For example, in one embodiment, memory cells 471 through 477 include non-volatile (e.g., flash EPROM, EEPROM, fuse, or antifuse) devices whose stored values are respectively applied to switch circuits 431 through 437, which are made up of volatile gates (e.g., SRAM pass transistor). In another embodiment, memory cells 471 through 477 are volatile (e.g., SRAM or DRAM) memory devices. In yet another embodiment, switch circuits 431 through 437 may be constructed using non-volatile elements (e.g., fuse, or antifuse), and memory cells 471 through 477 may be omitted.

Sum-of-products element 480 includes input terminals 481 through 489 and an output terminal 490. Input terminals 481 through 487 are respectively connected to output terminals 451 through 457 of switch circuits 431 through 437. Biasing circuits, such as pull-down resistor 481-A (see FIG. 3), are connected to input terminals 481–487 to apply low input signals to sum-of-products element 480 when input terminals 481–487 are not used. Input terminal 489 is connected to output terminal 429 of P-term element 409, which represents a last sequential P-term element of FB 400. Output terminal 490 is connected to switch matrix 130 in a manner similar to that described above with reference to conventional CPLD 100.

Operating Method

Figure 4:
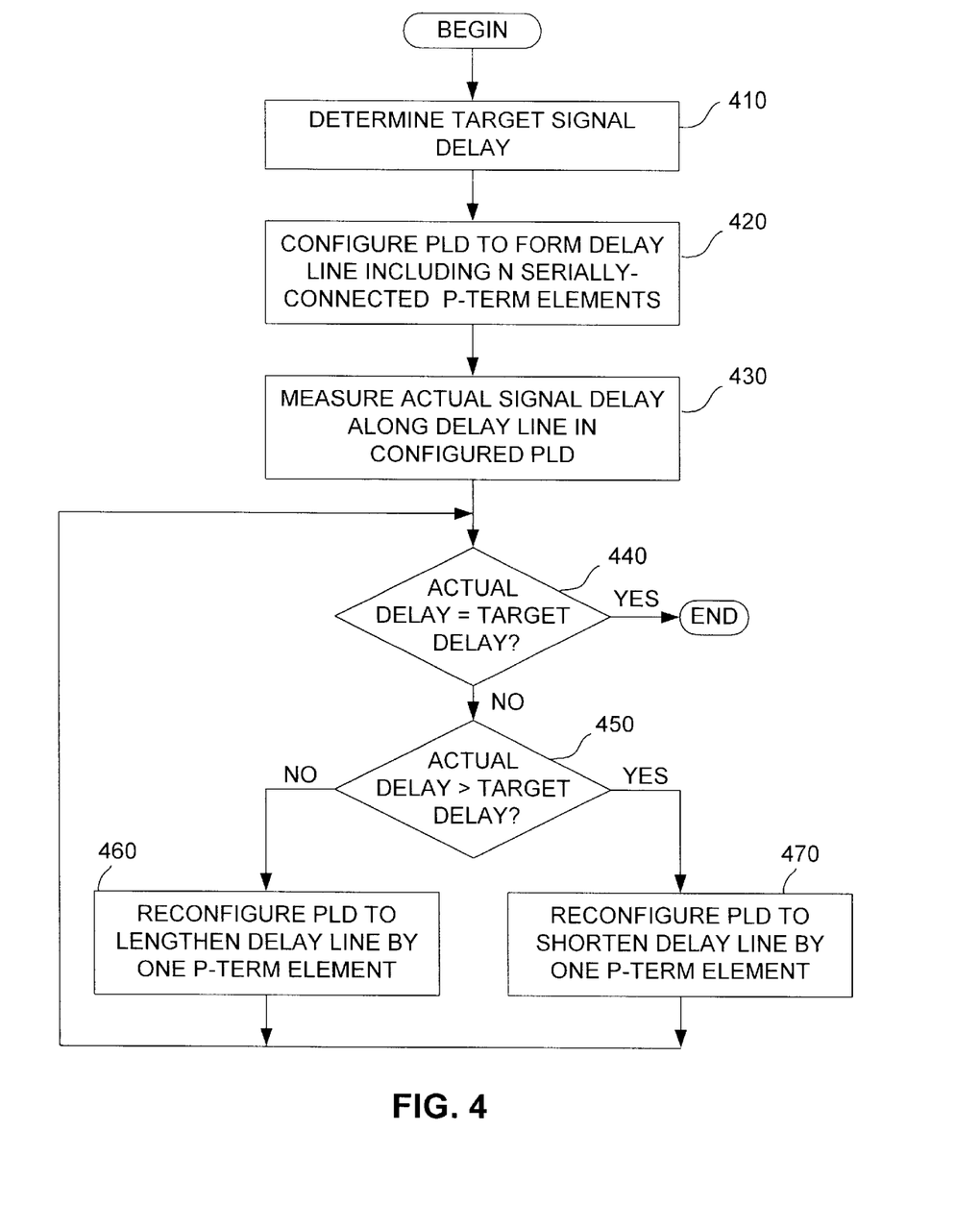
FIG. 4 is a flow diagram illustrating a method of operating the CPLD shown in FIG. 3 to adjust the delay line length.

FIG. 4 is a flow diagram showing a method of operating CPLD 300 that implements a delay line in accordance with a second aspect of the present invention.

Referring to FIG. 4, the method begins by determining a target signal delay amount (step 410) that is required by the adjustable length delay line structure of CPLD 300. As described in the background section (above), the target signal delay amount is determined for a system using known methods in order to synchronize various signals that are to arrive simultaneously at, for example, a central processing circuit.

Once the target signal amount is determined, CPLD 300 is configured using initial configuration data to produce a delay line in which a calculated number N of P-term elements are connected in series to form a delay line (step 420). In one embodiment, the calculated number N of P-term elements is determined by dividing the target signal delay by an expected (average) incremental delay produced by each P-term element of a hypothetical model CPLD 300. Of course, any signal delay produced by I/O blocks 120, switch matrix 130, and other logic circuitry of FB 400 is also included in the calculation.

Next, each configured CPLD 300 is measured to determine whether an actual signal delay produced by the delay line is equal to the target signal delay. As mentioned above, fabrication process parameters often cause small variations in the incremental delay produced by each P-term element, thereby causing the actual signal delay to be greater or less than the estimated signal delay.

Next, the configuration of each CPLD 300 is selectively adjusted (i.e., the CPLD is reconfigured to change the number of P-terms included in the delay line) until the actual signal delay is equal to the target signal delay (step 440). In one embodiment, this process involves determining whether the actual signal delay is greater or less than the target signal delay (step 450). When the actual signal delay is less than the target signal delay, then CPLD 300 is reconfigured to lengthen the delay line by one P-term element (step 460). Alternatively, when the actual signal delay is greater than the target signal delay, then CPLD 300 is reconfigured to shorten the delay line by one P-term element (step 470). In the disclosed embodiment, the process of adjusting the delay line (steps 440 through 470) is repeated until the actual signal delay is equal to the target signal delay (YES in step 440). Those of ordinary skill in the art that several alternative methods for adjusting the delay line length may be used in place of the depicted embodiment.

Figure 5A:
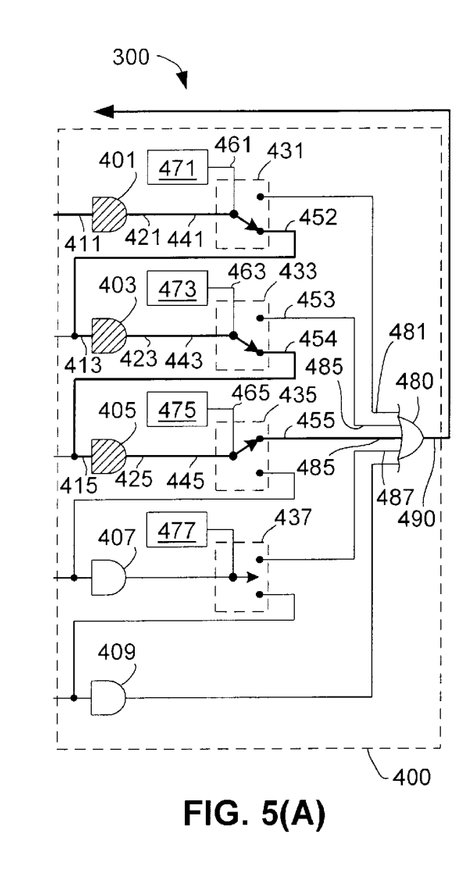
FIGS. 5(A) through 5(C) are simplified schematic diagrams illustrating the CPLD of FIG. 3 in accordance with various delay line configurations.
Figure 5B:
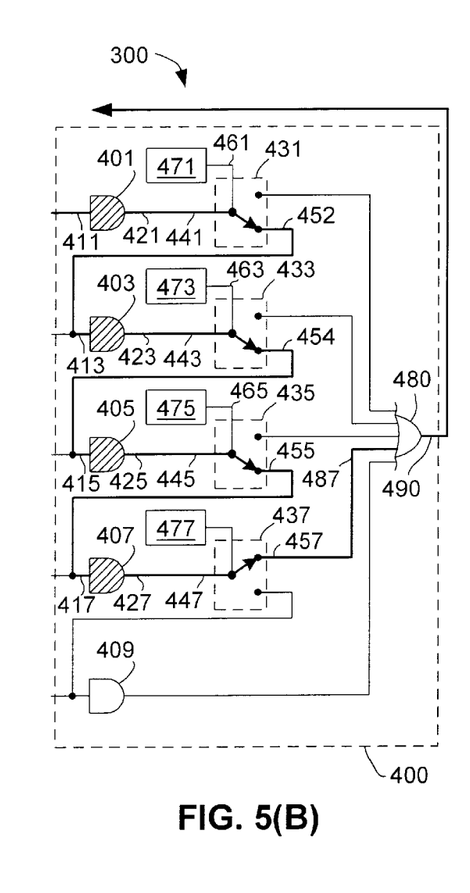
Figure 5C:
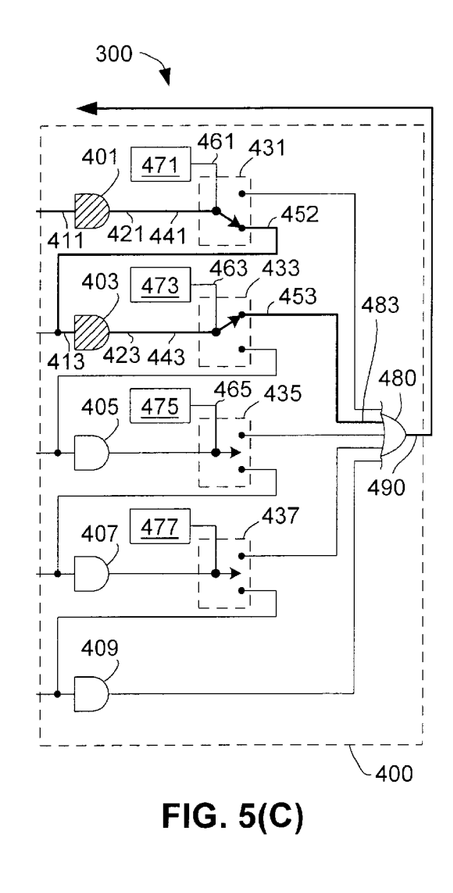

FIGS. 5(A) through 5(C) are simplified schematic diagrams showing a practical example of the method shown in FIG. 4. In these figures, each delay line is indicated by darker (heavy) lines, and the P-term elements included in each delay line are shaded for easy identification. FIG. 5(A) shows CPLD 300 in an initial configured state in which a delay line extends through P-term elements 401, 403, and 405. Specifically, as indicated by the darker lines, the delay line begins at input terminal 411 (first node), and extends through P-term element 401, switch 431, P-term element 403, switch 433, P-term element 405, switch 435, and sum-of-products element 480 to output terminal 490 (second node). Note that switches 431 and 433 are controlled by memory cells 461 and 463, respectively, to route signals from output terminals 421 and 423 of P-term elements 401 and 403 to input terminals 413 and 415 of P-term elements 403 and 405, respectively. Note that biasing circuits (not shown), such as pull-down resistor 481-A (see FIG. 3), are provided to pull down unused input terminals 481 and 483. In contrast, switch 435 is controlled by memory cell 435 to route the signal from P-term element 405 to sum-of-products element 480. Switch 437 is maintained in a neutral ("don't care") state (input terminal 487 is pulled down in the manner described above). Accordingly, the delay line produced by the configuration shown in FIG. 5(A) is made up of three P-term elements. Note that P-term 409 must be controlled using known methods to generate a logic "low" (0) output signal.

FIG. 5(B) shows CPLD 300 after method step 460 (see FIG. 4), in which the delay line is lengthened to include P-term element 407. Specifically, the logic value stored in memory cell 475 is changed, thereby causing switch 435 to connect input terminal 445 to output terminal 455 so that the delay line includes P-term element 407. Note that memory cell 477 is also changed, if necessary, thereby causing switch 437 to route signals from input terminal 447 to output terminal 457, and on to input terminal 487 of sum-of-products element 480. Accordingly, a relatively long delay line is formed between input terminal 411 and output terminal 490 that includes four P-term elements.

FIG. 5(C) shows CPLD 300 after method step 470 (see FIG. 4), in which the delay line is shortened to two P-term elements. Specifically, the logic value stored in memory cell 475 is changed, thereby causing switch 435 to enter the neutral state, and memory cell 473 is changed to store a logic value that causes switch 433 to route signals from input terminal 443 to output terminal 453, and on to input terminal 483 of sum-of-products element 480. Accordingly, a relatively short delay line is formed between input terminal 411 and output terminal 490 that includes two P-term elements.

Note that by selecting P-term 405 as the final P-term element of the delay line, the resulting delay line can be increased or decreased by two P-term elements without changing the "tap" point (i.e., output terminal 490 of sum-of-products element 480). That is, by initially configuring CPLD 300 such that the delay line is programmably connected to a central input terminal (e.g., input terminal 485)

of sum-of-products element 480, the delay line can be subsequently lengthened or shortened without changing the "tap" output node (i.e., output terminal 490) from which the delayed signal is transmitted. This approach is particularly useful in CPLDs that include function blocks similar to FE 600, described below, which support a delay line that extends through two or more macrocells.

Second Embodiment

Figure 6:
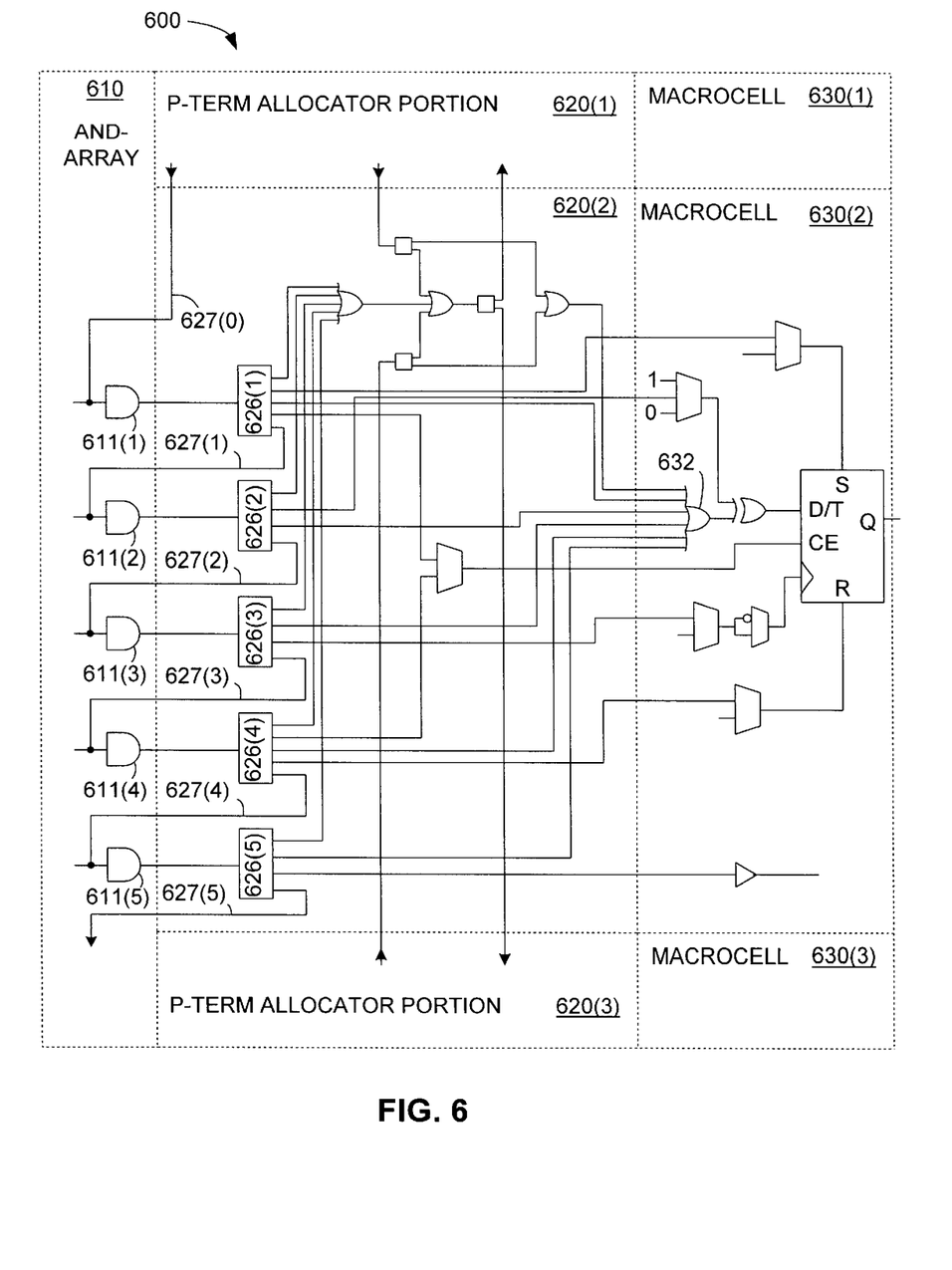
FIG. 6 is a simplified schematic diagram illustrating a portion of a CPLD function block that provides an adjustable length delay line structure in accordance with a second embodiment of the present invention.

FIG. 6 is a simplified schematic diagram illustrating a portion of a function block (FB) 600 incorporating an adjustable length delay line structure in accordance with a second embodiment of the present invention. Although not shown, FB 600 is included in a CPLD structure similar to CPLD 100 that is shown in FIG. 1 (i.e., FE 600 replace one or more FBs 200). Because the CPLD portions not shown in FIG. 6 are essentially identical to those described above with reference to CPLD 100, description of these CPLD portions is omitted for brevity.

FB 600 is similar to FB 200 (described above) in that it includes an AND-array 610, a series of P-term allocator portions 620(1) through 620(3), and an associated series of macrocells 630(1) through 630(3). Other than the delay line structure (described below), AND-array 610, P-term allocator portions 620(1) through 620(3), and macrocells 630(1) through 630(3) operate substantially as described above with reference to CPLD 100.

In accordance with the second embodiment, a portion of an adjustable length delay line structure is formed by modified demultiplexers (DMUXs) 626(1) through 626(5) and delay path segments 627(0) through 627(5). Modified DMUXs 626(1) through 626(2) are similar to DMUXs 226(1) through 222(5) of CPLD 100, described above, but include an additional output terminal that is connected to delay path segments 627(1) through 627(5), respectively. As shown in FIG. 6, delay path segments 627(1) through 627(4) are connected between associated output terminals of modified DMUXs 626(1) through 626(4) and input terminals of P-term elements 611(2) through 611(5), respectively. Although not shown, delay path segment 627(0) is connected to an associated modified DMUX of P-term allocator portion 620(1), and delay path segment 627(5) is connected to an associated P-term element whose output terminal is received by P-term allocator portion 620(3). By providing an adjustable length delay line structure in this manner, the resulting delay line can extend the entire length of FB 600 (e.g., 90 P-term elements), or can be located anywhere along FB 600.

Although the present invention has been described with respect to certain specific embodiments, it will be clear to those skilled in the art that the inventive features of the present invention are applicable to other embodiments as well, all of which are intended to fall within the scope of the present invention.

I claim:

1. A programmable logic device comprising:
   a plurality of product-term elements, each product-term element having an input terminal and an output terminal;
   a sum-of-products element having a plurality of input terminals and an output terminal; and
   a plurality of switches, each switch including an input terminal connected to the output terminal of an associated product-term element of the plurality of product-term elements, and a first output terminal connected to the input terminal of an adjacent product-term element of the plurality of product-term elements, and a second output terminal connected to an associated input terminal of the sum-of-products element.

2. The programmable logic device according to claim 1, wherein each of the product term elements comprises a logic NAND gate, and wherein the sum-of-products term comprises a logic NAND gate.

3. The programmable logic device according to claim 1, wherein each switch further includes a control terminal, wherein the programmable logic device further comprises a plurality of memory cells, each memory cell being connected to the control terminal of an associated switch, and
   wherein the plurality of switches are controlled by logic values stored in the plurality of memory cells such that when a first memory cell of the plurality of memory cells applies a first logic value to the control terminal of its associated switch, the associated switch enters a first switching state in which signals are passed from the input terminal of the associated switch to the first output terminal, and such that when the first memory cell applies a second logic value to the control terminal of the associated switch, the associated switch enters a second switching state in which signals are passed from the input terminal of the associated switch to the second output terminal.

4. The programmable logic device according to claim 3, wherein the memory cell comprises a non-volatile memory circuit.

5. The programmable logic device according to claim 3, wherein the memory cell comprises a volatile memory circuit.

6. The programmable logic device according to claim 1, wherein each of the product term elements comprises a logic AND gate, and wherein the sum-of-products term comprises a logic OR gate.

7. A method of operating a programmable logic device, the method comprising:
   providing a plurality of product-term elements wherein each product-term element of the plurality of product-term elements introduces a unit delay period;
   providing a sum-of-products element;
   configuring the programmable logic device to form a delay line comprising a number of programmable switches, each programmable switch including an input terminal connected to an output terminal of an associated product-term element of the plurality of product-term elements, a first output terminal connected to the input terminal of an adjacent product-term element of the plurality of product-term elements, and a second output terminal connected to an associated input terminal of the sum-of-products element;
   measuring an actual signal delay of the delay line; and
   adjusting the delay line by changing the number of programmable switches, thereby changing the actual signal delay of the delay line to a predetermined target signal delay.

8. The method according to claim 7, wherein the step of adjusting the delay line comprises:
   determining whether the actual signal delay is greater than the target signal delay;
   when the actual signal delay is less than the target signal delay, lengthening the delay line by at least one product-term element, thereby increasing the actual signal delay; and
   when the actual signal delay is greater than the target signal delay, shortening the delay line by at least one product-term element, thereby decreasing the actual signal delay.

9. A programmable logic device comprising:

a first product-term element having an input terminal;

a second product-term element having a second input terminal;

a sum-of-products element; and a programmable switch including an input terminal connected to an output terminal of the first product-term element, a first output terminal connected to the input terminal of the second product-term element, and a second output terminal connected to an input terminal of the sum-of-products element.

10. The programmable logic device according to claim 9, wherein the programmable switch further includes a control terminal, wherein the programmable logic device further comprises a memory cell connected to the control terminal of the programmable switch, and wherein the programmable switch is controlled by logic values stored in the memory cell such that when the memory cell applies a first logic value to the control terminal of the programmable switch, the programmable switch enters a first switching state in which signals are passed from the input terminal of the programmable switch to the first output terminal, and when the memory cell applies a second logic value to the control terminal of the programmable switch, the programmable switch enters a second switching state in which signals are passed from the input terminal of the programmable switch to the second output terminal.

11. The programmable logic device according to claim 10, wherein the memory cell comprises a volatile memory circuit.

12. The programmable logic device according to claim 10, wherein the memory cell comprises a non-volatile memory circuit.

13. The programmable logic device according to claim 9, wherein the first and second product-term elements comprise logic NAND gates, and wherein the sum-of-products term comprises a logic NAND gate.

14. The programmable logic device according to claim 9, wherein the first and second product-term elements comprise logic AND gates, and wherein the sum-of-products term comprises a logic OR gate.

15. A programmable logic device comprising:

a plurality of product-term elements;

a sum-of-products element; and means, connected to output terminals of each of the plurality of product-term elements, for forming an adjustable length delay line by selectively routing product terms from each product term element to one of an input terminal of an associated adjacent product term element and an input terminal of the sum-of-products element, wherein each of the plurality of product term elements introduces a unit delay period to the adjustable length delay line.

16. The programmable logic device according to claim 15, wherein the means for forming an adjustable length delay line comprises a plurality of programmable switches, each programmable switch including an input terminal connected to an output terminal of a first product-term element, a first output terminal connected to the input terminal of an associated adjacent product-term element, and a second output terminal connected to an input terminal of the sum-of-products element.

17. The programmable logic device according to claim 16, wherein each programmable switch further includes a control terminal, wherein the programmable logic device further comprises a plurality of memory cells, each memory cell being connected to the control terminal of an associated programmable switch, and wherein each programmable switch is controlled by logic values stored in its associated memory cell such that when the associated memory cell applies a first logic value to the control terminal of the programmable switch, the programmable switch enters a first switching state in which product term signals are passed from the programmable switch to the associated adjacent product-term element, and when the associated memory cell applies a second logic value to the control terminal of the programmable switch, the programmable switch enters a second switching state in which product term signals are passed from the programmable switch to the sum-of-products element.

* * * * *